United States Patent
Kim et al.

(10) Patent No.: US 10,615,360 B2
(45) Date of Patent: Apr. 7, 2020

(54) ORGANIC LIGHT EMITTING DIODE AND ORGANIC LIGHT EMITTING DIODE DISPLAY INCLUDING THE SAME

(71) Applicant: SAMSUNG DISPLAY CO., LTD., Yongin-si, Gyeonggi-do (KR)

(72) Inventors: Dong Chan Kim, Gunpo-si (KR); Won Jong Kim, Suwon-si (KR); Eung Do Kim, Seoul (KR); Dong Kyu Seo, Hwaseong-si (KR); Ji Hye Lee, Incheon (KR); Da Hea Im, Incheon (KR); Sang Hoon Yim, Suwon-si (KR); Yoon Hyeung Cho, Yongin-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

(21) Appl. No.: 15/080,518

(22) Filed: Mar. 24, 2016

(65) Prior Publication Data
US 2017/0025631 A1    Jan. 26, 2017

(30) Foreign Application Priority Data
Jul. 22, 2015  (KR) ........................ 10-2015-0103888

(51) Int. Cl.
*H01L 51/50*    (2006.01)

(52) U.S. Cl.
CPC ...... *H01L 51/5092* (2013.01); *H01L 51/5072* (2013.01)

(58) Field of Classification Search
CPC ............ H01L 51/5072; H01L 51/5234; H01L 51/5221; H01L 51/5206; H01L 51/5203; H01L 51/5092
See application file for complete search history.

(56) References Cited

U.S. PATENT DOCUMENTS

| | | | | |
|---|---|---|---|---|
| 5,108,861 | A * | 4/1992 | Kovacs | G03G 5/142 430/128 |
| 5,200,668 | A * | 4/1993 | Ohashi | H01L 33/18 257/E33.004 |
| 6,872,472 | B2 * | 3/2005 | Liao | H01L 51/5036 257/102 |
| 8,766,291 | B2 | 7/2014 | Forrest et al. | |
| 2011/0057179 | A1 * | 3/2011 | Nowatari | H01L 51/5278 257/40 |
| 2012/0025171 | A1 * | 2/2012 | Canzler | B82Y 10/00 257/40 |

(Continued)

FOREIGN PATENT DOCUMENTS

| | | |
|---|---|---|
| CN | 1409413 A | 4/2003 |
| CN | 1438828 A | 8/2003 |

(Continued)

*Primary Examiner* — Michele Fan
(74) *Attorney, Agent, or Firm* — Lewis Roca Rothgerber Christie LLP

(57) ABSTRACT

An organic light emitting element according to an example embodiment of the present disclosure includes: an anode and a cathode facing each other; an emission layer between the anode and the cathode; an electron transfer layer between the emission layer and the cathode; and a buffer layer between the cathode and the electron transfer layer, wherein the buffer layer includes an inorganic metal halide having p-type semiconductor characteristics.

16 Claims, 6 Drawing Sheets

(56) References Cited

U.S. PATENT DOCUMENTS

2014/0061600 A1\* 3/2014 Kim .................... H01L 27/3211
                                                        257/40
2015/0207080 A1\* 7/2015 Yoshida ............. H01L 51/0072
                                                        428/212
2016/0315286 A1\* 10/2016 Kuroki ................ H01L 51/5215

FOREIGN PATENT DOCUMENTS

| CN | 104051655 A | \* | 9/2014 |
| CN | 104350626 A | | 2/2015 |
| CN | 104638162 A | \* | 5/2015 |
| KR | 10-0906782 B1 | | 7/2009 |
| KR | 10-2012-0010060 A | | 2/2012 |
| KR | 10-1341012 B1 | | 12/2013 |
| KR | 10-2015-0000061 A | | 1/2015 |
| WO | WO 2015/083660 A1 | | 6/2015 |

\* cited by examiner

ORGANIC LIGHT EMITTING DIODE AND ORGANIC LIGHT EMITTING DIODE DISPLAY INCLUDING THE SAME

CROSS-REFERENCE TO RELATED APPLICATION

This application claims priority to and the benefit of Korean Patent Application No. 10-2015-0103888 filed on Jul. 22, 2015 in the Korean Intellectual Property Office, the entire content of which is incorporated herein by reference.

BACKGROUND

1. Field

One or more aspects of embodiments of the present disclosure relate to an organic light emitting element and an organic light emitting diode display including the same.

2. Description of the Related Art

Recent trends toward lighter and thinner personal computers and televisions have increased the demand for lightweight and thin display devices, and flat panel displays such as liquid crystal displays (LCD) that have these features are being substituted for cathode ray tubes (CRTs). However, because an LCD is a passive display device, an additional back-light is needed as a light source, and LCDs have other disadvantages such as slow response times and narrow viewing angles.

An organic light emitting device is a self-emitting display element that is capable of overcoming the aforementioned limitations and has additional features of a wide viewing angle, excellent contrast, and fast response times.

An organic light emitting device includes an organic light emitting element for light emission. The organic light emitting element forms excitons from the combination of electrons injected from one electrode and holes injected from another electrode into an emission layer, and the excitons emit energy such that light is emitted.

A tandem type of white organic light emitting element (e.g., tandem white element, hereinafter referred to as 'a white organic light emitting element') is described in more detail as follows.

In a white organic light emitting element, each layer is deposited between the anode and the cathode without a mask when forming the light emitting diode (LED), and the organic layers including the organic emission layer are sequentially deposited by differentiating the components thereof under vacuum.

In this white organic light emitting element, the light is not emitted by a single material, but by a plurality of emission layers including light emission materials having PL (photoluminescence) peaks of different wavelengths. The plurality of emission layers emit light of different wavelengths, and the combined light spectrum generates white light.

The above information disclosed in this Background section is included only to enhance understanding of the background of the present disclosure, and may therefore contain information that does not form the prior art that is already known in this country to a person of ordinary skill in the art.

SUMMARY

One or more aspects of embodiments of the present disclosure are directed toward an organic light emitting diode display in which the organic structure is protected by a buffer layer from plasma generated during cathode formation, and in which the buffer layer between the cathode and an electron transfer layer improves efficiency.

An organic light emitting element according to an example embodiment of the present disclosure includes: an anode and a cathode facing each other; an emission layer between the anode and the cathode; an electron transfer layer between the emission layer and the cathode; and a buffer layer between the cathode and the electron transfer layer, wherein the buffer layer includes an inorganic metal halide having p-type semiconductor characteristics.

The buffer layer may include at least one compound selected from CuI, $PbI_2$, TlI, AgI, AgF, $HgI_2$, $CdI_2$, $SnI_2$, $BiI_3$, and $ZnI_2$.

The cathode may be a transparent.electrode, the anode may be a reflecting (e.g., reflective) electrode, and the organic light emitting element may be a top emission type (e.g., top emission element) in which light is emitted in the direction of the cathode (e.g., through the cathode).

The emission layer may include two layers or three layers.

The emission layer may include three layers, and each emission layer may emit one selected from red, green, and/or blue light.

The emission layer may include three layers, and each emission layer may emit one selected from blue and/or yellow light.

The emission layer may include two layers, and each emission layer may emit one selected from blue and/or yellow light.

The electron transfer layer may be doped with at least one material selected from a group 1 element, a group 2 element, a lanthanide element, and halides thereof (e.g., a halide salt of a group 1, group 2, or lanthanide element) to have n-type semiconductor characteristics.

The buffer layer and the electron transfer layer may contact (e.g., physically contact) each other. The buffer layer having p-type semiconductor characteristics and the electron transfer layer having n-type semiconductor characteristics may form a charge generation layer.

The evaporation temperature of the inorganic metal halide may be less than about 1000° C.

An organic light emitting diode display according to an example embodiment of the present disclosure includes: a substrate; a thin film transistor on the substrate; and an organic light emitting element connected to the thin film transistor, wherein the organic light emitting element includes: an anode and a cathode facing each other; an emission layer between the anode and the cathode; an electron transfer layer between the emission layer and the cathode; and a buffer layer between the cathode and the electron transfer layer, wherein the buffer layer includes an inorganic metal halide having p-type semiconductor characteristics.

The buffer layer may include at least one compound selected from CuI, $PbI_2$, TlI, AgI, AgF, $HgI_2$, $CdI_2$, $SnI_2$, $BiI_3$, and $ZnI_2$.

The cathode may be a transparent electrode, the anode may be a reflecting electrode, and the organic light emitting element may be a top emission type (e.g., top emission element) in which light is emitted in a direction of the cathode (e.g., through the cathode).

The emission layer may include two layers or three layers.

The emission layer may include three layers, and each emission layer may emit one selected from red, green, and/or blue light.

The emission layer may include three layers, and each emission layer may emit one selected from blue and/or yellow light.

The emission layer may include two layers, and each emission layer may emit one selected from blue and/or yellow light.

The electron transfer layer may be doped with at least one material selected from a group 1 element, a group 2 element, a lanthanide element, and halides thereof (e.g., a halide salt of a group 1, group 2, or lanthanide element) to have n-type semiconductor characteristics.

The buffer layer and the electron transfer layer may contact (e.g., physically contact) each other, and the buffer layer having p-type semiconductor characteristics and the electron transfer layer having n-type semiconductor characteristics may form a charge generation layer.

The evaporation temperature of the inorganic metal halide may be less than about 1000° C.

As described above, in the organic light emitting element and the organic light emitting diode display including the same, the buffer layer may be formed of the inorganic metal halide having p-type semiconductor characteristics and may be between the cathode and the electron transfer layer, thereby protecting the organic light emitting element from the plasma generated during cathode formation.

Also, the buffer layer having p-type semiconductor characteristics and the electron transfer layer having n-type semiconductor characteristics may function substantially like a charge generation layer, thereby improving the efficiency of a device.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
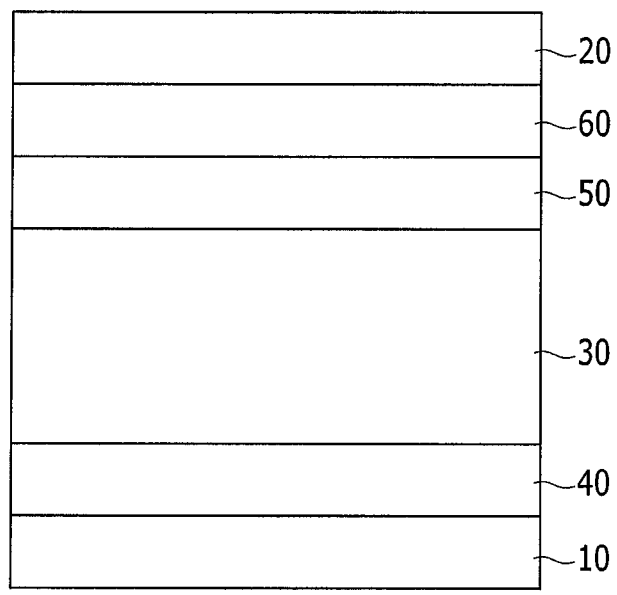
FIG. 1 is a cross-sectional view of an organic light emitting element according to an example embodiment of the present disclosure.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

In the drawings, the thickness of layers, films, panels, regions, etc., may be exaggerated for clarity. Like reference numerals designate like elements throughout the specification, and duplicative descriptions thereof will not be provided. It will be understood that when an element such as a layer, film, region, or substrate is referred to as being "on" another element, it can be directly on the other element or intervening elements may also be present. In contrast, when an element is referred to as being "directly on" another element, no intervening elements are present.

Hereinafter, an organic light emitting element according to an example embodiment of the present disclosure will be described in more detail with reference to the accompanying drawings.

FIG. 1 is a cross-sectional view of an organic light emitting element according to an example embodiment of the present disclosure.

Referring to FIG. 1, an organic light emitting element according to an example embodiment of the present disclosure includes an anode 10, a cathode 20 facing the anode 10, and an emission layer 30 between the anode 10 and the cathode 20.

The anode 10 may be a transparent electrode or an opaque electrode. The transparent electrode may, for example, be formed of a conductive oxide (e.g., a thin film of conductive oxide) such as indium tin oxide (ITO), indium zinc oxide (IZO), tin oxide ($SnO_2$), and/or a combination thereof, or a thin film of a metal such as aluminum (Al), silver (Ag), and magnesium (Mg), but embodiments of the present disclosure are not limited thereto. The opaque electrode may be made of a metal such as aluminum, silver, magnesium, and/or the like. As used herein, the terms "combination", "combination thereof" and "combinations thereof" may refer to a chemical combination (e.g., an alloy or chemical compound), a mixture, or a laminated structure of components.

The anode 10 of the organic light emitting element according to an example embodiment of the present disclosure may have a layered structure including a reflective layer made of silver (Ag), aluminum (Al), chromium (Cr), molybdenum (Mo), tungsten (W), titanium (Ti), gold (Au), palladium (Pd), or an alloy film thereof, and an electrical reflective layer (e.g., an electrically conductive reflective layer) made of a transparent electrode material such as ITO, IZO, or ZnO.

The anode 10 may be formed using a sputtering method, a vapor phase deposition method, an ion beam deposition method, an electron beam deposition method, and/or a laser ablation method.

In an example embodiment of the present disclosure, the anode 10 may have a triple layer structure of silver (Ag)/indium tin oxide (ITO)/silver (Ag). For example, the anode in an example embodiment of the present disclosure may be a reflecting (e.g., reflective) electrode.

The cathode 20 may include a material having a small work function to facilitate easy electron injection. The cathode 20 may be formed of a metal, and in some embodiments, may be formed as a transparent electrode.

For example, the material may be a metal such as magnesium (Mg), calcium (Ca), sodium (Na), potassium (K), titanium (Ti), indium (In), yttrium (Y), lithium (Li), gadolinium (Gd), aluminum (Al), silver (Ag), tin (Sn), lead (Pb), cesium (Cs), barium (Ba), and/or the like, or an alloy or mixture thereof, or a multi-layered structure material such as LiF/Al, $LiO_2$/Al, LiF/Ca, LiF/Al, and/or $BaF_2$/Ca, but embodiments of the present disclosure are not limited thereto. A metallic electrode such as aluminum may be used as the cathode 20.

Non-limiting examples of the conductive material used as the cathode 20 according to an example embodiment of the present disclosure may include magnesium, calcium, tin, lead, titanium, yttrium, lithium, ruthenium (Ru), manganese (Mn), aluminum, lithium fluoride, and the like, and/or an alloy thereof, and examples of the alloy may include magnesium/silver, magnesium/indium, lithium/aluminum, and the like. The ratio (e.g., amounts) of alloys may be controlled and suitably selected by controlling the temperature of the deposition source, the atmosphere (e.g., the composition of the atmosphere), the degree of vacuum, and/or the like.

In some embodiments, the cathode may be formed as a transparent electrode. In this case, the cathode may have a structure in which a transparent electrode material such as ITO, IZO, or ZnO, etc. is deposited. In the case of a top emission type of organic light emitting element (e.g., top emission element) in which the light formed in the organic light emitting element is emitted in the cathode direction (e.g., through the cathode), the cathode must be formed of a material that can transmit light.

The organic light emitting element of an example embodiment of the present disclosure may be a top emission type of organic light emitting element (e.g., top emission element). Accordingly, in some embodiments, the anode is formed of a material that can reflect light and the cathode is formed of a material that can transmit light. In some embodiments, the anode may have a triple layer structure of silver (Ag)/indium tin oxide (ITO)/silver (Ag), and the cathode may be formed of ITO.

The emission layer 30 may include a light emission material that emits blue, red, or green light, and the emission layer 30 may include a host and a dopant. The material forming the emission layer 30 is not limited. Non-limiting examples of blue light emitting materials may include oxadiazole dimer dyes (bis-DAPDXP), spiro compounds (Spiro-DPVBi, Spiro-6P), triarylamine compounds, bis (styryl)amine (DPVBi, DSA), 4,4'-bis(9-ethyl-3-carbazovinylene)-1,1'-biphenyl (BCzVBi), perylene, 2,5,8,11-tetra-tert-butyl perylene (TPBe), (1,4-phenylene-di-2,1-ethene-diyl)bis[9-ethyl-9C] (BCzVB), 4,4-bis[4-(di-p-tolylamino) styryl]biphenyl (DPAVBi), 4-(di-p-tolylamino)-4'-[(di-p-tolylamino) styryl] stilbene (DPAVB), 4,4'-bis[4-(diphenylamino) styryl] biphenyl (BDAVBi), and bis(3,5-difluoro-2-(2-pyridyl) phenyl-(2-carboxypyridyl)iridium III (FlrPic). Non-limiting examples of green light emitting materials may include 3-(2-benzothiazolyl)-7-(diethylamino)coumarin (Coumarin 6), 2,3,6,7-tetrahydro-1,1,7,7,-tetramethyl-1H, 5H,11H-10-(2-benzothiazolyl) quinolizino-[9,9a,1gh] coumarin (C5451), N,N'-dimethyl-quinacridone (DMQA), and tris(2-phenylpyridine)iridium(III) (Ir(ppy)$_3$). Non-limiting examples of red light emitting materials may include tetraphenylnaphthacene, rubrene, tris(1-phenyl isoquinoline) iridium(III) (Ir(piq)$_3$), bis(2-benzo[b] thiophen-2-yl-pyridine) (acetylacetonate) iridium(III) (Ir(btp)$_2$(acac)), tris (dibenzoylmethane) phenanthroline europium(III) (Eu(dbm)$_3$(phen)), tris[4,4'-di-tert-butyl-(2,2')-bipyridine] ruthenium (III) complex (Ru(dtb-bpy)$_3$.2 PF$_6$), DCM1, DCM2, Eu(thenoyltrifluoroacetone)$_3$ (Eu(TTA)$_3$), and 4-(dicyanomethylene)-2-tert-butyl-6-(1,1,7,7-tetramethyljulolidin-4-yl-vinyl)-4H-pyran) (DCJTB). Non-limiting examples of the polymer light emitting material may include a phenylene-based polymer, a phenylene-vinylene-based polymer, a thiophene-based polymer, a fluorine-based polymer, a spiro-fluorene-based polymer, and an aromatic compound including nitrogen.

The emission layer 30 may be manufactured by adding a light emission dopant to the emission layer host. Non-limiting examples of fluorescence emission host materials may include tris(8-hydroxy-quinolinato) aluminum (Alq3), 9,10-di(naphthyridin-2-yl) anthracene (AND), 3-tert-butyl-9,10-di(naphth-2-yl) anthracene (TBADN), 4,4'-bis (2,2-diphenyl-ethene-1-yl)-4,4'-biphenyl (DPVBi), 4,4'-bis (2,2-diphenyl-ethene-1-yl)-4,4'-dimethylbiphenyl (p-DMDPVBi), tert(9,9-diaryl fluorene)s (TDAF), 2-(9,9'-spirobifluorene-2-yl)-9,9'-spirobifluorene (BSDF), 2,7-bis (9,9'-spirobifluorene-2-yl)-9,9'-spirobifluorene (TSDF), bis (9,9-diaryl fluorene)s (BDAF), and 4,4'-bis(2,2-diphenyl-ethene-1-yl)-4,4'-di-(tert-butyl)phenyl (p-TDPVBi) etc. Non-limiting examples of phosphorescence emission host materials may include 1,3-bis(carbazole-9-yl)benzene (mCP), 1,3,5-tris(carbazole-9-yl)benzene (tCP), 4,4',4"-tris (carbazole-9-yl)triphenylamine (TcTa), 4,4'-bis(carbazole-9-yl)biphenyl (CBP), 4,4'-bis(9-carbazole-yl)-2,2'-dimethyl-biphenyl (CBDP), 4,4'-bis(carbazole-9-yl)-9,9-dimethylfluorene (DMFL-CBP), 4,4'-bis(carbazole-9-yl)-9, 9-bis(9-phenyl-9H-carbazole)fluorene (FL-4CBP), 4,4'-bis (carbazole-9-yl)-9,9-ditolylfluorene (DPFL-CBP), and 9,9-bis(9-phenyl-9H-carbazole)fluorene (FL-2CBP) etc.

The content (e.g., amount) of the dopant may be varied depending on the material used to form the emission layer. In one or more embodiments, the content of the dopant is about 3 to 10 weight percent based on an emission layer material total of 100 weight percent (the total weight of the host and the dopant).

The emission layer 30 may be formed as a single layer, or as two or more layers to display a plurality of colors. When the organic light emitting element displays a single color, the emission layer 30 only emits one color, as shown in FIG. 1.

When the organic light emitting diode display includes an organic light emitting element, each of the adjacent organic light emitting elements may emit light of a different color such as red, green, and/or blue, and the colors may combine to emit (e.g., form) white light.

Figure 2:
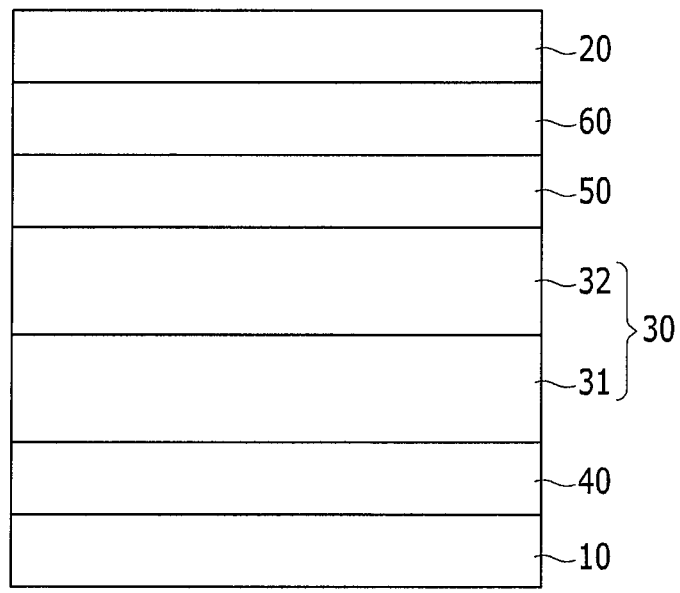
FIG. 2 is a cross-sectional view of an organic light emitting element according to an example embodiment of the present disclosure.
Figure 3:
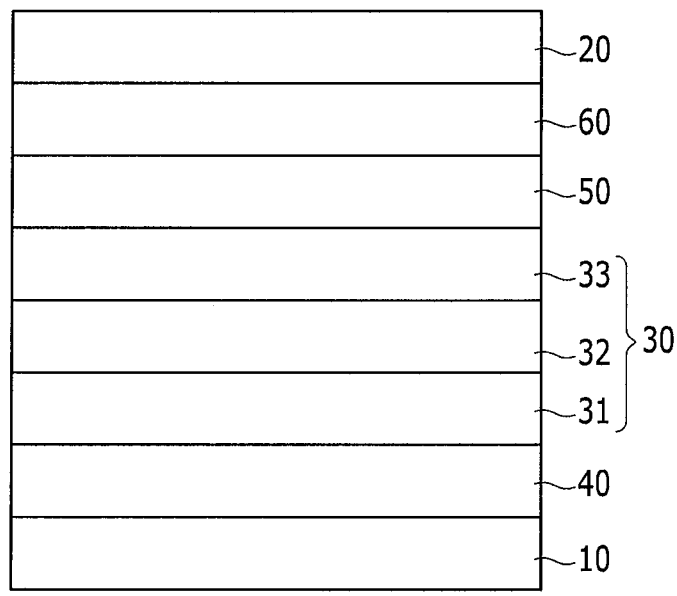
FIG. 3 is a cross-sectional view of an organic light emitting element according to an example embodiment of the present disclosure.

According to the example embodiments of the present disclosure shown in FIG. 2 or FIG. 3, the organic light emitting element may include various color layers. When the organic light emitting elements is a tandem type of white organic light emitting element (e.g., tandem white OLED), at least two or more emission layers 30 may be formed.

A charge generation layer may be between the first emission layer 31 and the second emission layer 32 of the organic light emitting element as shown in FIG. 2 and FIG. 3, or between the second emission layer 32 and the third emission layer 33.

An additional layer may be between the first emission layer 31 and the third emission layer 33. Non-limiting examples of an additional layer may include a hole layer such as a hole injection layer and a hole transfer layer, an emission layer, and/or an auxiliary layer such as an electron transfer layer and an electron injection layer.

In the organic light emitting element according to the example embodiment of FIG. 2, the first emission layer 31 and the second emission layer 32 may include organic materials respectively emitting blue and yellow light.

In the case of the organic light emitting element according to the example embodiment of FIG. 3, the first emission layer 31, the second emission layer 32, and the third emission layer 33 may respectively include organic materials emitting red, green, and blue light.

The first emission layer 31 may include an organic material emitting blue light, the second emission layer 32 may include an organic material emitting yellow light, and third emission layer 33 may include an organic material emitting blue light.

The different colors of light emitted from the emission layers may mix to produce white light. However, this is only one example, and a plurality of organic layers of various structures, shapes, and materials may be used to produce white light.

A hole transfer layer 40 may be between the anode 10 and the emission layer 30.

The hole transfer layer 40 may be formed of a carbazole derivative such as N-phenylcarbazole, polyvinylcarbazole, and/or an typical amine derivative having an aromatic condensed ring such as N,N'-bis(3-methylphenyl)-N,N'-diphenyl-[1,1-biphenyl]-4,4'-diamine (TPD) and N,N'-di(naphthalene-1-yl)-N,N'-diphenyl benzidine (NPD).

An electron transfer layer 50 is between the cathode 20 and the emission layer 30.

The electron transfer layer 50 may include at least one compound selected from a quinoline derivative. Non-limiting examples of such compounds may include tris(8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (BAlq), bis(10-hydroxybenzo[h]quinolinato)beryllium (Bebq2), and 4,7-diphenyl-1,10-phenanthroline (BPhen). The compound selected from the above group may be doped with LiQ (lithium 8-hydroxyquinolato). The doping concentration (e.g., amount) may be about 50 wt %.

The electron transfer layer 50 may be n-doped (e.g., negatively doped) with a compound selected from a group 1 element, a group 2 element, a lanthanide element, or a halide thereof (e.g., a halide salt of a group 1, group 2, or lanthanide element). The n-type characteristics of the electron transfer layer may be improved by the dopant.

A buffer layer 60 is between the electron transfer layer 50 and the cathode 20. The buffer layer 60 may include an inorganic metal halide having p-type semiconductor characteristics.

For example, the buffer layer 60 may include at least one material selected from the group including CuI, $PbI_2$, TlI, AgI, AgF, $HgI_2$, $CdI_2$, $SnI_2$, $BiI_3$, and $ZnI_2$.

The inorganic metal halide included in the buffer layer 60 may have a transmittance of more than about 80% in the visible light region. The refractive index may be more (e.g., higher) than about 1.8.

The inorganic metal halide may have higher electrical conductivity (e.g., may be more electrically conductive) than the semiconductor. The band gap of the inorganic metal halide may be more (e.g., larger) than about 2 eV.

The buffer layer 60 may protect the underlying organic structure.

To realize the top emission type or kind of organic light emitting element, which emits the light in the direction of the cathode 20 (e.g., through the cathode), embodiments of the cathode 20 are made of transparent conductive material. When ITO is deposited as the cathode material, the ITO cathode may be deposited using a PVD (plasma vapor deposition) method. The organic material in the underlying structure (e.g., in the emission layer, the electron transfer layer, or the hole transfer layer) may be damaged by the plasma used during cathode deposition when the buffer layer is not present.

However, the organic light emitting element according to an example embodiment of the present disclosure includes the buffer layer 60 between the electron transfer layer 50 and the cathode 20, and may thereby prevent or reduce such plasma damage. The buffer layer 60 may protect the underlying organic material structure.

The buffer layer 60 of the present disclosure may be made of the inorganic metal halide having p-type semiconductor characteristics and may contact (e.g., physically contact) the electron transfer layer having n-type semiconductor characteristics such that the buffer layer 60 and the electron transfer layer 50 function substantially like one charge generation layer.

A charge generation layer may be between adjacent emission layers, and may control charge balancing between adjacent emission layers.

The charge generation layer may include an n-type charge generation layer and a p-type charge generation layer. In an example embodiment of the present disclosure, since the buffer layer 60 made of the inorganic metal halide having p-type semiconductor characteristics functions like a p-type charge generation layer, and the electron transfer layer functions like an n-type charge generation layer, the buffer layer and the electron transfer layer may function substantially like one charge generation layer.

Accordingly, the efficiency of embodiments of the organic light emitting element may be improved.

To increase the efficiency of the organic light emitting element according to an example embodiment of the present disclosure, the electron transfer layer may be doped to have further high (e.g., increased) n-type characteristics. For example, in the organic light emitting element according to an example embodiment of the present disclosure, the buffer layer 60 is an inorganic metal layer and the electron transfer layer 50 is based on an organic material, thereby generating a charge density difference.

To compensate for the charge density difference, the electron transfer layer according to an example embodiment of the present disclosure may be doped with a compound selected from a group 1 element, the group 2 element, the lanthanide element, and halides thereof (e.g., a halide salt of a group 1, group 2, or lanthanide element). For example, a bipolar material such as KI, RbI, and CsI may be used as a dopant.

When the buffer layer 60 according to the present example embodiment is formed, the thermal evaporation temperature of the metal halide may be lower than the thermal evaporation temperature used to form a buffer layer of the corresponding metal oxide.

When a metal oxide is used as the buffer layer 60, the evaporation temperature may be high and the formation process may be time-consuming and complicated. For example, when a metal oxide such as $MoO_3$, $V_2O_5$, ITO, $TiO_2$, $WO_3$, or $SnO_2$ is used as the buffer layer 60, a high temperature of more than about 1000° C. may be utilized to form the layer.

The inorganic metal halide having p-type semiconductor characteristics according to an example embodiment of the present disclosure may have a lower thermal evaporation temperature than the analogous metal oxide. For example, when CuI is used as the buffer layer 60 according to an example embodiment of the present disclosure, the evaporation temperature of about 300° C. at about 4 Pa (Pascals) is remarkably low compared to that of the metal oxide.

Accordingly, compared with that of forming a buffer layer of the metal oxide, the process of forming a buffer layer of metal halide may be simplified and the cost may be reduced.

Figure 5:
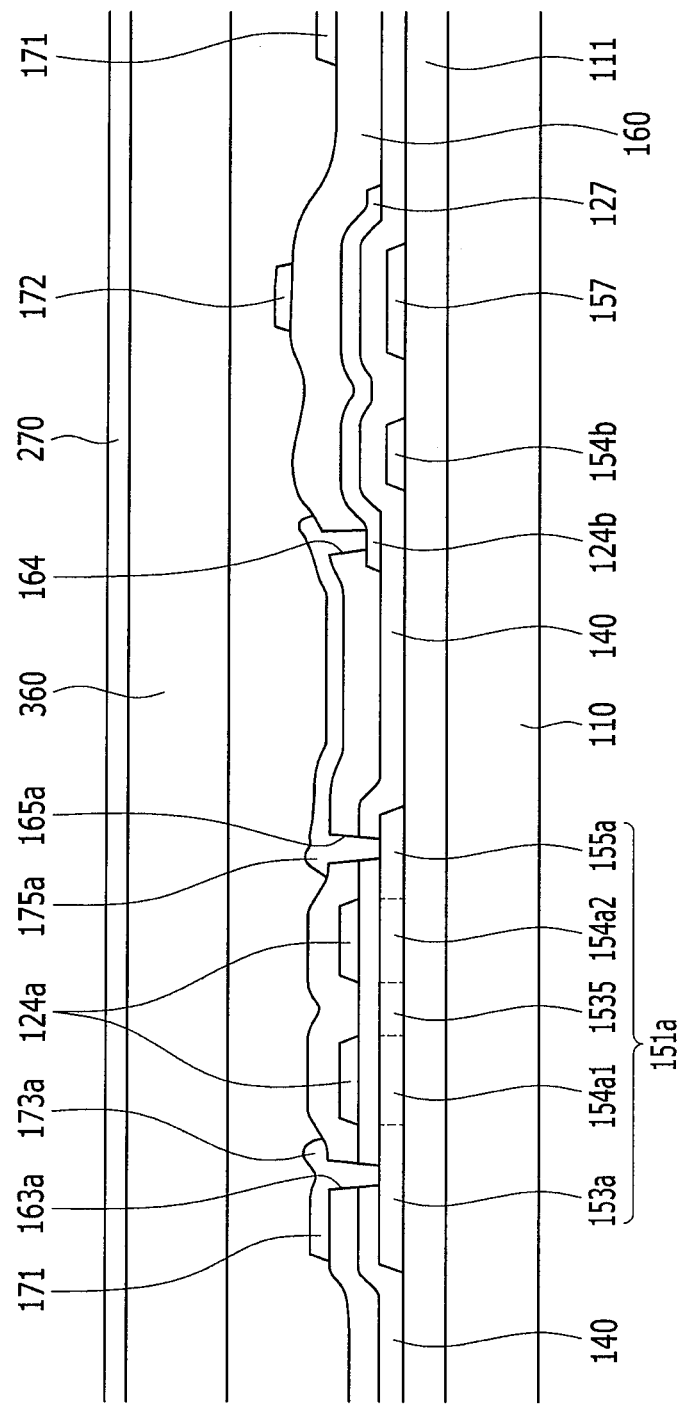
FIG. 5 is a cross-sectional view of the organic light emitting diode display of FIG. 4 taken along a cutting line V-V.
Figure 6:
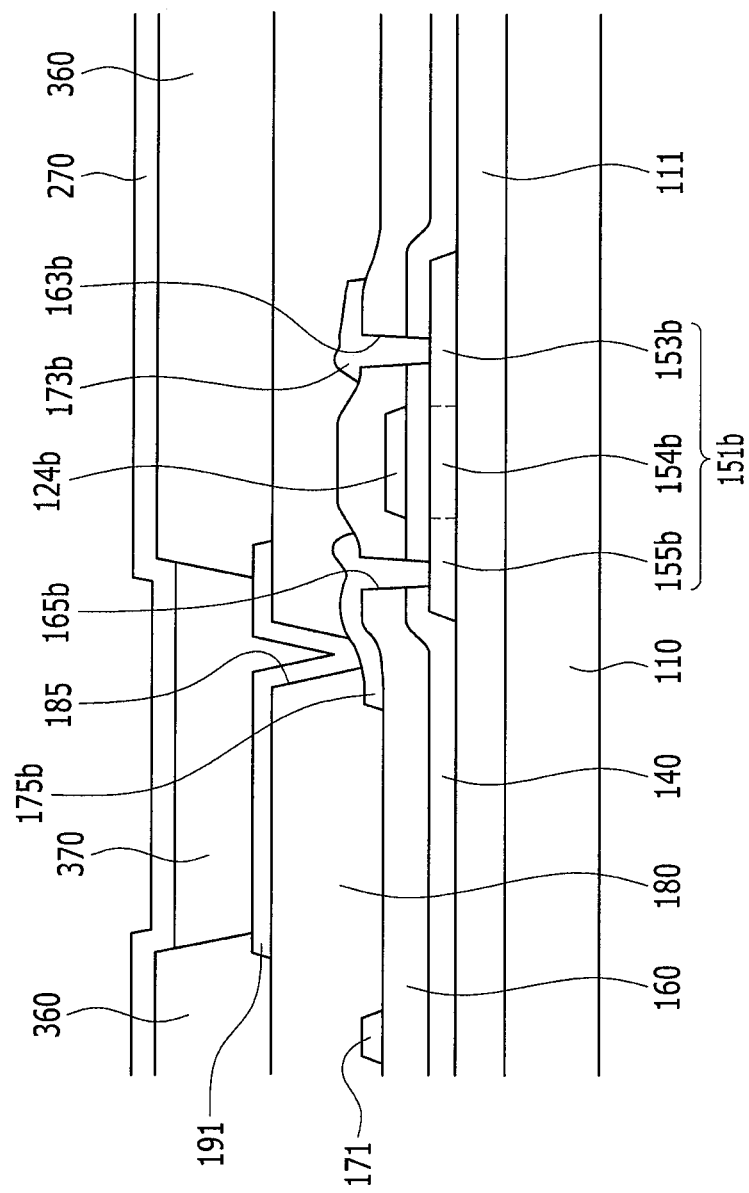
FIG. 6 is a cross-sectional view of the organic light emitting diode display of FIG. 4 taken along a cutting line VI-VI.

Hereinafter, the organic light emitting diode display including the organic light emitting element according to an example embodiment of the present disclosure will be described in more detail with reference to FIG. 4 to FIG. 6.

Figure 4:
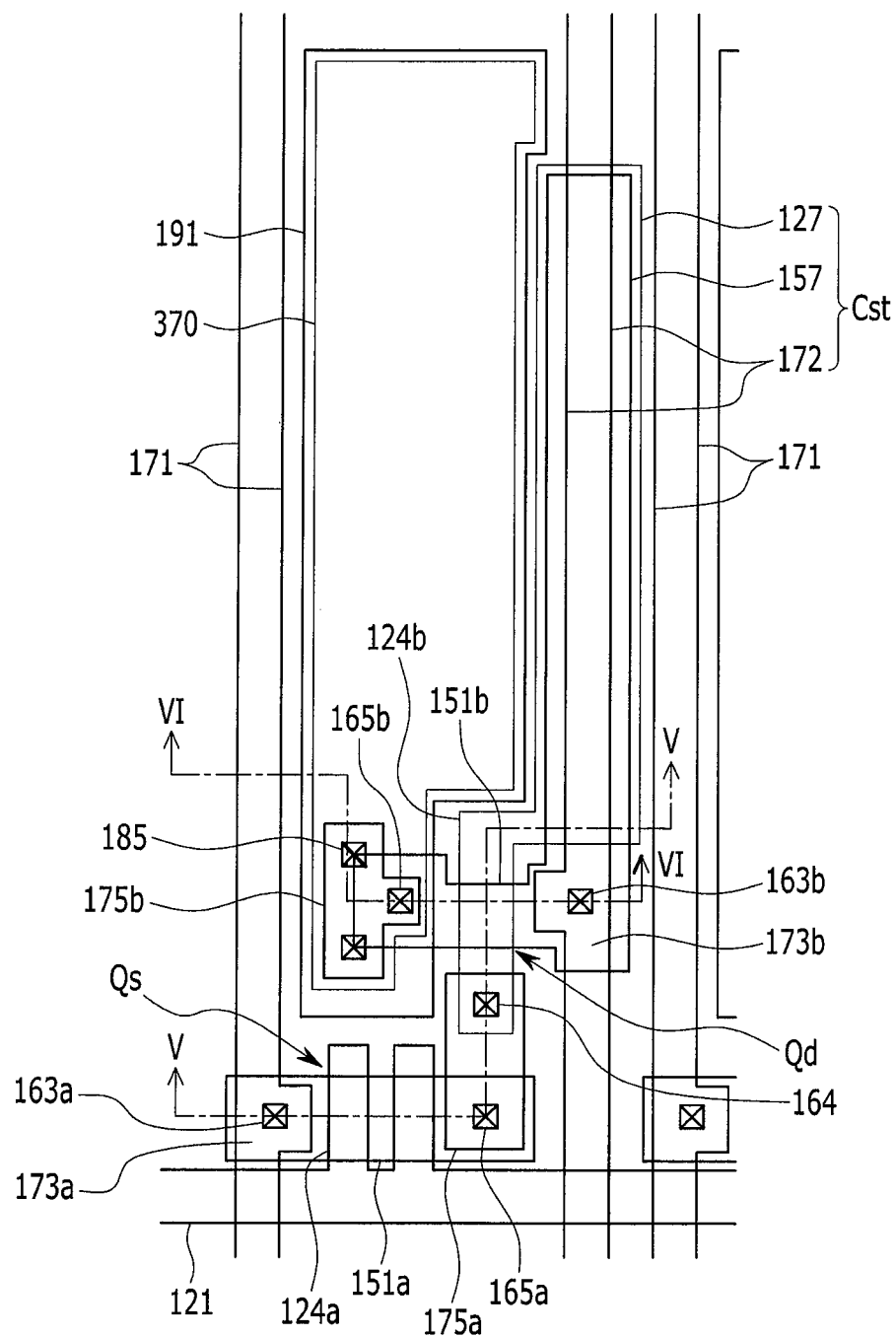
FIG. 4 is a layout view of an organic light emitting diode display according to an example embodiment of the present disclosure.

FIG. 4 is a layout view of an organic light emitting diode display according to an example embodiment of the present disclosure. FIG. 5 is a cross-sectional view of the organic light emitting diode display of FIG. 4 taken along a cutting line V-V. FIG. 6 is a cross-sectional view of the organic light emitting diode display of FIG. 4 taken along a cutting line VI-VI.

A blocking layer 111 made of a silicon oxide or a silicon nitride is formed on a substrate 110 made of transparent glass. The blocking layer 111 may have a dual-layered structure.

A plurality of pairs of first and second semiconductor islands 151a and 151b that may be made of polysilicon are formed on the blocking layer 111. The semiconductor islands 151a and 151b may respectively include a plurality of extrinsic regions including conductive impurities of an n-type or a p-type, and at least one intrinsic region that does not include conductive impurities.

In the first semiconductor island 151a, the extrinsic region includes first source and drain regions 153a and 155a and an intermediate region 1535, which may be doped with n-type impurities and separated from each other. The intrinsic region includes a pair of first channel regions 154a1 and 154a2 between the extrinsic regions 153a, 1535, and 155a.

In the second semiconductor island 151b, the extrinsic region includes second source and drain regions 153b and 155b, which may be doped with p-type impurities and separated from each other. The intrinsic region includes a second channel region 154b between the second source and drain regions 153b and 155b and a storage region 157 extending upward from the second drain region 153b.

The extrinsic region may further include lightly doped regions between the channel regions 154a1, 154a2, and 154b, and the source and drain regions 153a, 155a, 153b, and 155b. The lightly doped regions may be formed at offset regions that do not include impurities.

In some embodiments, the extrinsic regions 153a and 155a of the first semiconductor island 151a may be doped with p-type impurities, and the extrinsic regions 153b and 155b of the second semiconductor island 151b may be doped with n-type impurities. The conductive p-type impurity may be boron (B) or gallium (Ga), and the conductive n-type impurity may be phosphorus (P) or arsenic (As).

A gate insulating layer 140 made of a silicon nitride or silicon oxide is formed on the semiconductor islands 151a and 151b and the blocking layer 111.

A plurality of gate conductors including a plurality of gate lines 121 having a plurality of first control electrodes 124a and a plurality of second control electrodes 124b are formed on the gate insulating layer 140.

The gate lines 121 transmit gate signals and are substantially extended in the transverse direction. The first control electrode 124a extends upward from the gate line 121, thereby intersecting the first semiconductor island 151a, and substantially overlapping the first channel regions 154a1 and 154a2. Each gate line 121 may include an end portion having a large area for contact (e.g., physical contact) with another layer or an external driving circuit. When a gate driving circuit for generating gate signals is formed directly on the substrate 110, the gate lines 121 may extend and be directly connected to the gate driving circuit.

The second control electrode 124b is separated from the gate line 121 and overlaps the second channel region 154b of the second semiconductor island 151b. The second control electrode 124b is extended thereby forming a storage electrode 127, and the storage electrode 127 overlaps the storage region 157 of the second semiconductor 151b.

The gate conductors 121 and 124b may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti), and/or the like. The control electrodes 124a and 124b may have a multi-layer structure including two conductive layers that have different physical properties from each other. One of the conductive layers may be formed using a metal having low resistivity, such as an aluminum-based metal, a silver-based metal, or a copper-based metal, in order to reduce signal delay or voltage drop. Other conductive layers may be formed using a material having good physical, chemical, and electrical contact characteristics with indium tin oxide (ITO) and indium zinc oxide (IZO), such as a molybdenum-based metal, chromium, tantalum, titanium, or the like. Non-limiting examples of the combination may include a lower chromium film and an upper aluminum (alloy) film, and a lower aluminum (alloy) film and an upper molybdenum (alloy) film. However, the gate conductors 121 and 124b may be made of any suitable combination of metals or conductors.

The side surfaces of the gate conductors 121 and 124b may be inclined to the surface of the substrate 110, and the inclination angle thereof may be about 30° to about 80°.

An interlayer insulating layer 160 is formed on the gate conductors 121 and 124b. The interlayer insulating layer 160 may be made of an inorganic insulator such as a silicon nitride, a silicon oxide, and/or the like, an organic insulator, or an insulator having a low dielectric ratio. The dielectric constant of the insulator may be less than 4.0, and may be, for example, a-Si:C:O or a-Si:O:F, which may be formed through plasma enhanced chemical vapor deposition (PECVD). The interlayer insulating layer 160 may be made of a photosensitive organic insulator and may provide a flat surface.

The interlayer insulating layer 160 has a plurality of contact holes 164 exposing the second control electrodes 124b. The interlayer insulating layer 160 and the gate insulating layer 140 have a plurality of contact holes 163a, 163b, 165a, and 165b exposing the source and drain regions 153a, 153b, 155a, and 155b.

A plurality of data conductors, including data lines 171, driving voltage lines 172, and first and second output electrodes 175a and 175b are formed on the interlayer insulating layer 160.

The data lines 171 transmit data signals and extend in a substantially longitudinal direction, thereby intersecting the gate lines 121. Each data line 171 includes a first input electrode 173a connected to the first source region 153a through the contact hole 163a, and may include an end portion having a large area for contact (e.g., physical contact) with another layer or an external driving circuit. When a data driving circuit for generating data signals is formed directly on the substrate 110, the data line 171 may extend and be directly connected to the data driving circuit.

The driving voltage lines 172 transmit a driving voltage and extend in a substantially longitudinal direction, thereby intersecting the gate lines 121. Each driving voltage line 172 includes a plurality of second input electrodes 173b connected to the second source region 153b through the contact hole 163b. The driving voltage line 172 overlaps the storage electrode 127, and they may be connected to each other.

The first output electrode 175a is separated from the data line 171 and the driving voltage line 172. The first output electrode 175a is connected to the first drain region 155a through the contact hole 165a, and to the second control electrode 124b through the contact hole 164.

The second output electrode 175b is separated from the data line 171, the driving voltage line 172, and the first output electrode 175a, and is connected to the second drain region 155b through the contact hole 165b.

The data conductors 171, 172, 175a, and 175b may be made of a refractory metal such as molybdenum, chromium, tantalum, and/or titanium, or alloys thereof, and may have a multi-layered structure including a refractory metal layer and a low resistance conductive layer. A multi-layered structure may include, for example, a dual layer structure including a chromium or molybdenum (alloy) lower layer and an aluminum (alloy) upper layer, and a triple layer structure including a molybdenum (alloy) lower layer, an aluminum (alloy) middle layer, and a molybdenum (alloy) upper layer. However, the data conductors 171, 172, 175a, and 175b may be made of any suitable metals or conductors.

The side surfaces of the data conductors 171, 172, 175a, and 175b may also be inclined to the surface of the substrate 110, and the inclination angles thereof may be about 30° to about 80°, like the gate conductors 121 and 124b.

A passivation layer 180 is formed on the data conductors 171, 172, 175a, and 175b. The passivation layer 180 may be made of an inorganic material, an organic material, or an insulating material having a low dielectric ratio.

The passivation layer 180 has a plurality of contact holes 185 exposing the second output electrodes 175b. The passivation layer 180 may have a plurality of contact holes exposing the end portions of the data lines 171, and the passivation layer 180 and the interlayer insulating layer 160 may have a plurality of contact holes exposing the end portions of the gate lines 121.

A plurality of pixel electrodes 191 are formed on the passivation layer 180. The pixel electrodes 191 are physically and electrically connected to the second output electrodes 175b through the contact holes 185, and may be made of a transparent conductive material such as ITO or IZO, or a reflective conductor such as silver, aluminum, or alloys thereof.

A plurality of contact assistants or connecting members may be formed on the passivation layer 180, and may be connected to exposed ends of the gate lines 121 and the data lines 171.

Partitions 360 are formed on the passivation layer 180. The partitions 360 may define a plurality of openings by enclosing the edges of the pixel electrodes 191 like a bank, and may be made of an organic insulator or an inorganic insulator. The partitions 360 may be made of a photoresist including black pigments, and the partitions 360 may function as a light blocking member, thereby simplifying the manufacturing process.

A light emitting element layer 370 is formed on the pixel electrode 191 and a common electrode 270 is formed on the light emitting element layer 370. As described above, an organic light emitting element including the pixel electrode 191, the light emitting element layer 370, and the common electrode 270 is formed.

The description of the organic light emitting element may be the same as described above. For example, the organic light emitting element may have a structure including the anode/the hole injection layer/the hole transfer layer/the emission layer/the electron transfer layer/the electron injection layer/the cathode.

In one embodiment, the pixel electrode 191 is an anode which functions as the hole injection electrode, and the common electrode 270 is a cathode which functions as the electron injection electrode. However, example embodiments of the present disclosure are not limited thereto, and according to the driving method of the organic light emitting device, the pixel electrode 191 may be a cathode and the common electrode 270 may be an anode. Holes and electrons may be injected into the light emitting element layer 370 from the pixel electrode 191 and the common electrode 270, respectively, and an exciton generated by coupling (e.g., combining) the injected hole and electron may fall (e.g., transition) from an excited state to a ground state to emit light.

The common electrode 270 is formed on the light emitting element layer 370. The common electrode 270 receives a common voltage, and may be made of a reflective metal including calcium (Ca), barium (Ba), magnesium (Mg), aluminum (Al), silver (Ag), and/or the like, or a transparent conductive material such as ITO or IZO.

In the organic light emitting diode display according to the present example embodiment, the description of the hole transfer layer/the emission layer/the electron transfer layer/the buffer layer configuring the organic light emitting element may be the same as described above.

The buffer layer may include the inorganic metal halide having p-type semiconductor characteristics.

The buffer layer may include at least one compound selected from the group including $CuI$, $PbI_2$, $TlI$, $AgI$, $AgF$, $HgI_2$, $CdI_2$, $SnI_2$, $BiI_3$, and $ZnI_2$.

The inorganic metal halide included in the buffer layer may have a transmittance of more than about 80% in the visible light region. The refractive index may be more (e.g., higher) than about 1.8. The inorganic metal halide may have higher electrical conductivity (e.g., may be more electrically conductive) than the semiconductor. The band gap of the inorganic metal halide may be more (e.g., larger) than about 2 eV.

The electron transfer layer may be doped with the material selected from a group 1 element, a group 2 element, a lanthanide element, and halides thereof (e.g., a halide salt of a group 1, group 2, or lanthanide element). For example, a material selected from KI, RbI, and CsI may be used as a dopant.

The emission layer may be formed as a single layer or as two or more layers to display a plurality of colors. When the device includes a plurality of emission layers, additional layer types may be included, for example, a hole injection layer, a hole transfer layer, an emission layer, an electron transfer layer, and/or an electron injection layer.

When a plurality of emission layers are formed, the emission layers may include organic materials respectively emitting blue and yellow light.

Also, each emission layer may include organic materials respectively emitting red, green, and blue light, or organic materials sequentially emitting blue and yellow light.

The different colors of light emitted from the emission layers may mix to produce white light. However, this is only one example, and a plurality of organic layers of various structures, shapes, and materials may be used to produce white light.

When the emission layer is formed as a single layer, the adjacent organic light emitting elements may respectively emit different colors of light such as red, green, and blue light, and white light may be produced by combining each color.

In the organic light emitting device, the first semiconductor island 151a, the first control electrode 124a connected to the gate line 121, the first input electrode 173a connected to the data line 171, and the first output electrode 175a form the switching thin film transistor Qs, and the channel of the switching thin film transistor Qs is formed on the pair of first channel regions 154a1 and 154a2 of the first semiconductor island 151a. The second semiconductor island 151b, the second control electrode 124b connected to the first output electrode 175a, the second input electrode 173b connected to the driving voltage line 172, and the output electrode 175b connected to the pixel electrode 191 form the driving thin film transistor Qd, and the channel of the driving thin film transistor Qd is formed in the second channel region 154b of the second semiconductor island 151b. In one embodiment, the pixel electrode 191, the light emitting element layer 370, and the common electrode 270 form the organic light emitting diode, and the pixel electrode 191 is the anode while the common electrode 270 is the cathode. In another embodiment, the pixel electrode 191 may be the cathode while the common electrode 270 may be the anode. The storage electrode 127, the driving voltage line 172, and the storage region 157 may overlap each other to form a storage capacitor Cst.

The switching thin film transistor Qs transmits a data signal of the data line 171 in response to a gate signal of the gate line 121. Upon receiving the data signal, the driving thin film transistor Qd transmits a current that depends on the voltage difference between the second control electrode 124b and the second input electrode 173b. The voltage difference between the second control electrode 124b and the second input electrode 173b is charged to the storage capacitor Cst and then maintained even after the switching thin film transistor Qs is turned off. The organic light emitting diode may display an image by emitting light, the strength (e.g., intensity) of which may vary depending on the current of the driving thin film transistor Qd.

The structure of the described organic light emitting diode display is one example, and the organic light emitting element according to an example embodiment of the present disclosure may be clearly applied to an organic light emitting diode display having a different structure.

As used herein, expressions such as "at least one of" and "one of", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims and equivalents thereof.

| Description of Some of the Symbols | |
| --- | --- |
| 10: anode | 20: cathode |
| 30: emission layer | 40: hole transfer layer |
| 50: electron transfer layer | 60: buffer layer |
| 110: substrate | 121: gate line |
| 140: gate insulating layer | 151: semiconductor |
| 171: data line | 180: passivation layer |
| 191: pixel electrode | 270: common electrode |

What is claimed is:

1. An organic light emitting element comprising:
an anode and a cathode facing each other;
an emission layer between the anode and the cathode;
an electron transfer layer having n-type semiconductor characteristics between the emission layer and the cathode, the electron transfer layer comprising a quinoline derivative and a dopant; and
a buffer layer between the cathode and the electron transfer layer, the buffer layer being directly on the cathode, and the buffer layer and the electron transfer layer contacting each other,
wherein the buffer layer comprises an inorganic metal halide having p-type semiconductor characteristics,
wherein the buffer layer having p-type semiconductor characteristics and the electron transfer layer having n-type semiconductor characteristics form a charge generation layer, and
wherein an evaporation temperature of the inorganic metal halide is less than about 1000° C.

2. The organic light emitting element of claim 1, wherein the buffer layer comprises at least one compound selected from CuI, $PbI_2$, TlI, AgI, AgF, $HgI_2$, $CdI_2$, $SnI_2$, $BiI_3$, and $ZnI_2$.

3. The organic light emitting element of claim 1, wherein:
the cathode is a transparent electrode,
the anode is a reflecting electrode, and
the organic light emitting element is a top emission type in which light is emitted in a direction of the cathode.

4. The organic light emitting element of claim 1, wherein the emission layer comprises two layers or three layers.

5. The organic light emitting element of claim 4, wherein the emission layer comprises three layers, and each emission layer emits one selected from red, green, and blue light.

6. The organic light emitting element of claim 4, wherein the emission layer comprises three layers, and each emission layer emits one selected from blue and yellow light.

7. The organic light emitting element of claim 4, wherein the emission layer comprises two layers, and each emission layer emits one selected from blue and yellow light.

8. The organic light emitting element of claim 1,
wherein the dopant comprises at least one material selected from a group 1 element, a group 2 element, a lanthanide element, and halides thereof.

9. An organic light emitting diode display comprising:
a substrate;
a thin film transistor on the substrate; and an organic light emitting element connected to the thin film transistor;
wherein the organic light emitting element includes:
an anode and a cathode facing each other;
an emission layer between the anode and the cathode;
an electron transfer layer having n-type semiconductor characteristics between the emission layer and the cathode, the electron transfer layer comprising a quinoline derivative and a dopant; and
a buffer layer between the cathode and the electron transfer layer, the buffer layer being directly on the cathode, and the buffer layer and the electron transfer layer contacting each other,
wherein the buffer layer comprises an inorganic metal halide having p-type semiconductor characteristics,
wherein the buffer layer having p-type semiconductor characteristics and the electron transfer layer having n-type semiconductor characteristics form a charge generation layer, and
wherein an evaporation temperature of the inorganic metal halide is less than about 1000° C.

10. The organic light emitting diode display of claim 9, wherein the buffer layer comprises at least one selected from CuI, $PbI_2$, TlI, AgI, AgF, $HgI_2$, $CdI_2$, $SnI_2$, $BiI_3$, and $ZnI_2$.

11. The organic light emitting diode display of claim 9, wherein:
the cathode is a transparent electrode,
the anode is a reflecting electrode, and
the organic light emitting element is a top emission type in which light is emitted in a direction of the cathode.

12. The organic light emitting diode display of claim 9, wherein the emission layer comprises two layers or three layers.

13. The organic light emitting diode display of claim 12, wherein the emission layer comprises three layers, and each emission layer emits one selected from red, green, and blue light.

14. The organic light emitting diode display of claim 12, wherein the emission layer comprises two layers, and each emission layer emits one selected from blue and yellow light.

15. The organic light emitting diode display of claim 12, wherein the emission layer comprises three layers, and each emission layer emits one selected from blue and yellow light.

16. The organic light emitting diode display of claim 12, wherein the dopant comprises at least one material selected from a group 1 element, a group 2 element, a lanthanide element, and halides thereof.

* * * * *